United States Patent
Sim

(10) Patent No.: US 9,224,832 B2
(45) Date of Patent: Dec. 29, 2015

(54) SEMICONDUCTOR INTEGRATED CIRCUIT APPARATUS AND METHOD OF MANUFACTURING THE SAME

(71) Applicant: SK hynix Inc., Gyeonggi-do (KR)

(72) Inventor: Joon Seop Sim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 117 days.

(21) Appl. No.: 14/046,468

(22) Filed: Oct. 4, 2013

(65) Prior Publication Data

US 2014/0361240 A1 Dec. 11, 2014

(30) Foreign Application Priority Data

Jun. 5, 2013 (KR) .................. 10-2013-0064579

(51) Int. Cl.
*H01L 29/66* (2006.01)
*H01L 27/24* (2006.01)

(52) U.S. Cl.
CPC ...... *H01L 29/66666* (2013.01); *H01L 27/2454* (2013.01)

(58) Field of Classification Search
CPC .................. H01L 29/66666; H01L 27/2454
See application file for complete search history.

(56) References Cited

U.S. PATENT DOCUMENTS

2008/0258208 A1*  10/2008  Hirler et al. ............... 257/328
2014/0252494 A1*  9/2014  Lui et al. .................... 257/379

FOREIGN PATENT DOCUMENTS

KR          101096226        12/2011
KR         1020130104527      9/2013

* cited by examiner

*Primary Examiner* — Matthew Reames
(74) *Attorney, Agent, or Firm* — IP & T Group LLP

(57) ABSTRACT

A semiconductor integrated circuit apparatus and a method of manufacturing the same are provided. The semiconductor integrated circuit apparatus includes a semiconductor substrate having an active island, a gate buried in a predetermined portion of the active island, a source and a drain formed at both sides of the gate, and a current blocking layer formed in the active island corresponding to a lower portion of the drain. When current flows in from the drain, the current blocking layer is configured to discharge the current into the inside of the semiconductor substrate through a lower portion of the source.

6 Claims, 5 Drawing Sheets

SEMICONDUCTOR INTEGRATED CIRCUIT APPARATUS AND METHOD OF MANUFACTURING THE SAME

CROSS-REFERENCES TO RELATED APPLICATION

This application claims priority under 35 U.S.C. 119(a) to Korean application number 10-2013-0064579, filed on Jun. 5, 2013, in the Korean Patent Intellectual Property Office, which is incorporated by reference in its entirety.

BACKGROUND OF THE INVENTION

1. Technical Field

The inventive concept relates to a semiconductor integrated circuit apparatus and a method of manufacturing the same, and more particularly, to a resistance variable memory device having a horizontal channel structure and a method of manufacturing the same.

2. Related Art

With the rapid development of mobile and digital information communication and consumer-electronic industry, studies on existing electronic charge controlled-devices are expected to encounter the limitation. Thus, new functional memory devices of the new concept other than the existing electronic charge devices need to be developed. In particular, next-generation memory devices with large capacity, ultra-high speed, and ultra-low power need to be developed.

Currently, resistance variable memory devices using a resistance device as a memory medium have been suggested as the next-generation memory devices, and there are typically phase-change random access memories (PCRAMs), resistance RAMs (ReRAMs), and magnetoresistive RAMs (MRAMs) as the variable resistive memory devices.

The resistance variable memory devices may be basically configured of a switching device and a resistance device, and store data "0" or "1" according to a state of the resistance device.

Even in the variable resistive memory devices, the first priority is to improve integration density and to integrate memory cells in a limited and small area as many as possible.

Currently, a method of configuring the resistance variable memory device in a three-dimensional (3D) structure is suggested and demands on a method of stably stacking a plurality of memory cells with a narrow critical dimension are growing.

As a manufacturing method of a typical 3D structure resistance variable memory device, a method (or a vertical channel manner) of manufacturing a switching device using a vertical pillar and a method of forming a horizontal channel by floating an active region substantially perpendicular to a surface of a semiconductor substrate are suggested.

The vertical channel method and the horizontal channel method employing a 3D structure may improve an integration density, but are complicated in a fabrication process.

SUMMARY

According to an embodiment, there is provided a semiconductor integrated circuit apparatus. The semiconductor integrated circuit apparatus may include a semiconductor substrate having an active island, a gate buried in a predetermined portion of the active island, a source and a drain formed at both sides of the gate, and a current blocking layer suitable for discharging the current into the semiconductor substrate through a lower portion of the source.

According to an embodiment, there is provided a method of manufacturing a semiconductor integrated circuit apparatus. The method may include forming an active island by etching a semiconductor substrate by a predetermined depth, forming a gate region by etching a predetermined portion of the active island, forming a first impurity region in the active island by implanting a first impurity into the active island, forming a gate by burying a conductive material in the gate region, forming a source and a drain region by implanting an impurity having an opposite conductivity to the first impurity region into the first impurity region at both sides of the gate, and implanting an impurity having substantially the same conductivity as the first impurity into a lower portion of the drain.

According to an embodiment, there is provided a method of manufacturing a semiconductor integrated circuit apparatus. The method may include forming an active island by etching a semiconductor substrate by a predetermined depth, forming a gate region by etching a predetermined portion of the active island, forming a first impurity region in the active island by implanting a first impurity into the active island, forming a gate by burying a conductive material in the gate region, forming a current blocking layer by implanting an impurity having substantially the same conductivity as the first impurity region into lower portions of both sides of the gate, and forming a source and a drain by implanting an impurity having an opposite conductivity to the first impurity region above the current blocking layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
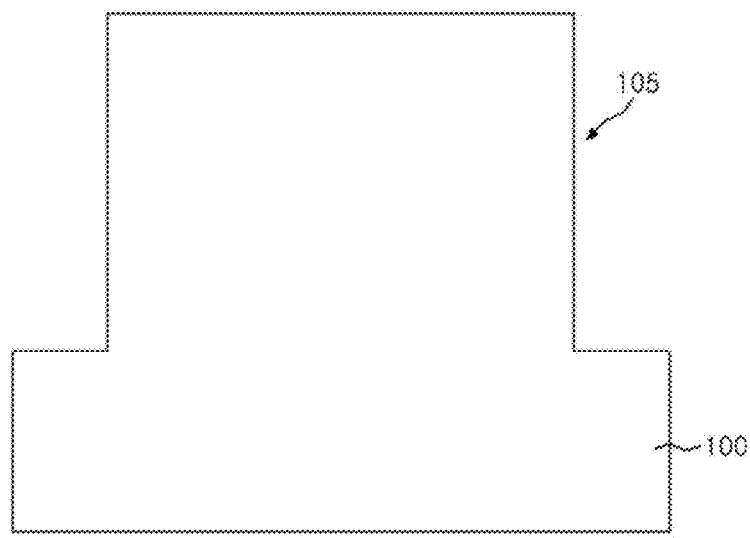
FIGS. 1 to 5 are cross-sectional views for processes illustrating a method of manufacturing a semiconductor integrated circuit apparatus according to an embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it may be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Referring to FIG. 1, an active island 105 may be formed by etching a predetermined portion of a semiconductor substrate 100, for example, a bare silicon substrate 100 by a certain depth. Thus, the active island 105 protrudes from an upper surface of the semiconductor substrate 100, as shown in FIG. 1. The upper surface of the semiconductor substrate is substantially flat, as shown in FIG. 1. In such a structure, assuming that the upper surface of the semiconductor substrate is located at a first level, the active island 105 vertically extends from the first level up to a second level higher than the first level.

Figure 2:
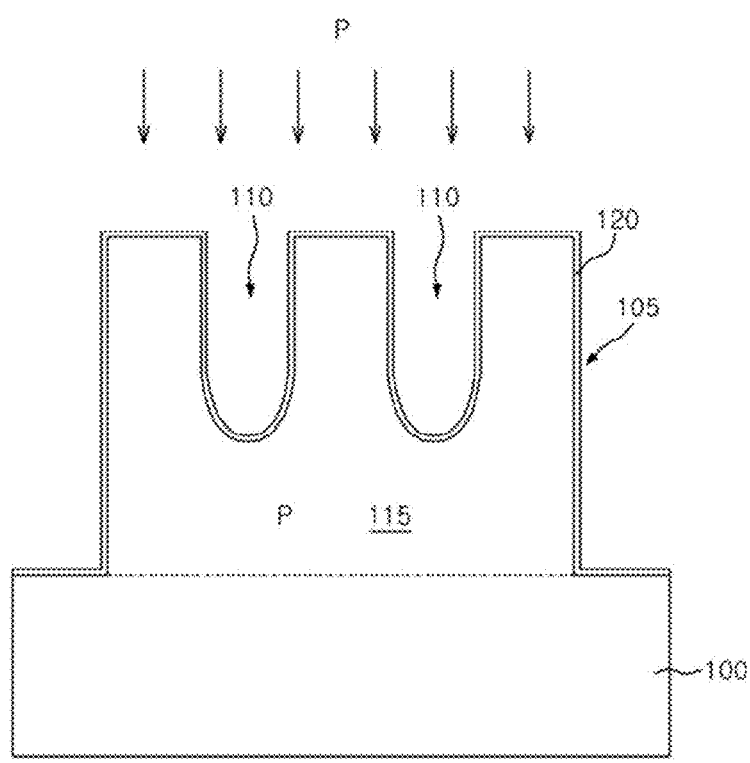

Referring to FIG. 2, a gate region 110 may be formed by etching a predetermined portion of the active island 105. The etching of forming the gate region may be performed using a mask pattern through a photolithographic process. A gate insulating layer 120 may be formed on a surface of the active island 105 in which the gate region 110 is formed and a surface of the semiconductor substrate 100. The gate insulating layer 120 may be formed, for example, using an oxidation method. A first impurity region 115 may be formed by implanting P type impurities into the active island 105. The process of forming the first impurity region 115 may be performed before and after the forming of the gate insulating layer 120.

Figure 3:
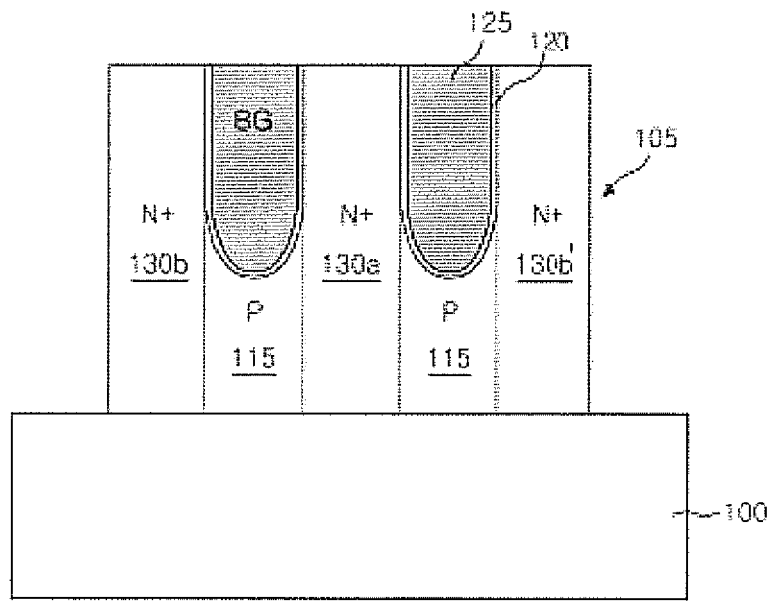

Referring to FIG. 3, a buried gate 125 may be formed by filling a conductive material to be filled within the gate region. The gate 125 may be formed by depositing a conductive material on the gate insulating layer 120 and planarizing the conductive material. Further, in the planarizing process, the gate insulating layer 120 other than the gate region 110 may be removed, or the gate insulating layer 120 may be left on a sidewall of the active island 105 substantially perpendicular to the semiconductor substrate 100. For example, one of the buried gates (hereinafter, a first buried gate) is spaced from the other buried gates (hereinafter, a second buried gate).

A source 130a and first and second drains 130b, 130b' are formed by implanting high concentration N type impurities into regions of the active island 105 at both sides of the gate electrode 125. For example, the source 130a is formed in the active island 105 positioned between the first and second buried gates 125. A first drain 130b is formed in the active island 105 corresponding to an outer side region of the first buried gate 125. A second drain 130b' is formed in the active island 105 corresponding to an outer side region of the second buried gate 125. See FIG. 3. Thus, the first impurity region 115 below the gate electrode 125 may serve as a channel region between the source 130a and the drain 130b. At this time, the active island 105 may include a pair of drains 130b sharing one source 130a. That is, one pair of transistors sharing the source 130a may be formed in the active island 105.

Figure 4:
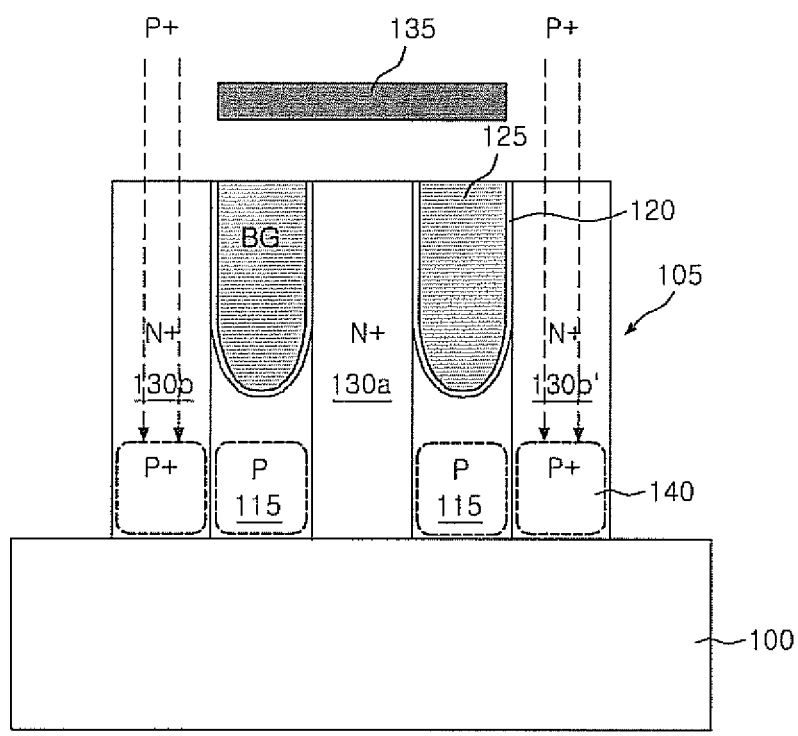

As illustrated in FIG. 4, a mask pattern 135 may be formed on the active island 105 to expose the drain 130b. A second impurity region 140 for current blocking may be formed by implanting high concentration P type impurities into a bottom of the drain 130b exposed by the mask pattern 135.

Figure 5:
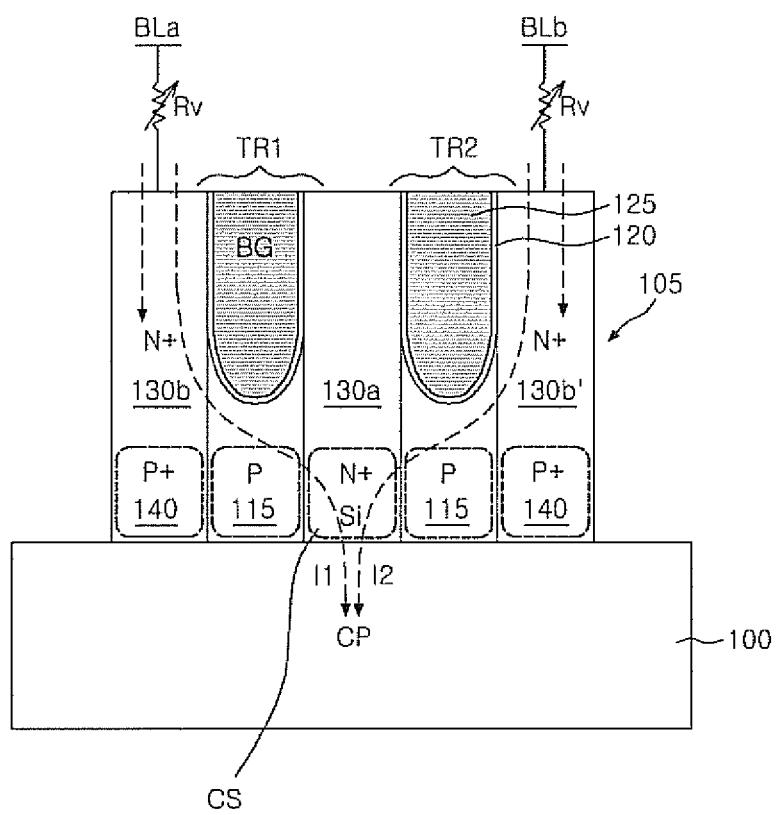

As illustrated in FIG. 5, the mask pattern 135 may be removed by a general method. Subsequently, although schematically illustrated in FIG. 5, variable resistors Rv are formed over the first and the second drains 130b and 130b', and bit lines BLa and BLb are formed to be coupled to the variable resistors Rv. A heat electrode (not shown) may be further formed between the variable resistor Rv and each of the first and the second drain 130b and 13b'. In the embodiment, a method of manufacturing the heating electrode, the variable resistor Rv, and the bit lines BLa and BLb may be substantially the same as a method of manufacturing a heat electrode, a variable resistor, and a bit line of an existing resistance variable memory device. Further, as the variable resistor Rv, a PCMO layer that is a material for a ReRAM, a chalcogenide layer that is a material for a PCRAM, a magnetic layer that is a material for a MRAM, a magnetization reversal device layer that is a material for a spin-transfer torque magnetoresistive RAM (STTMRAM), or a polymer layer that is a material for a polymer RAM (PoRAM) may be used variously.

Figure 6:
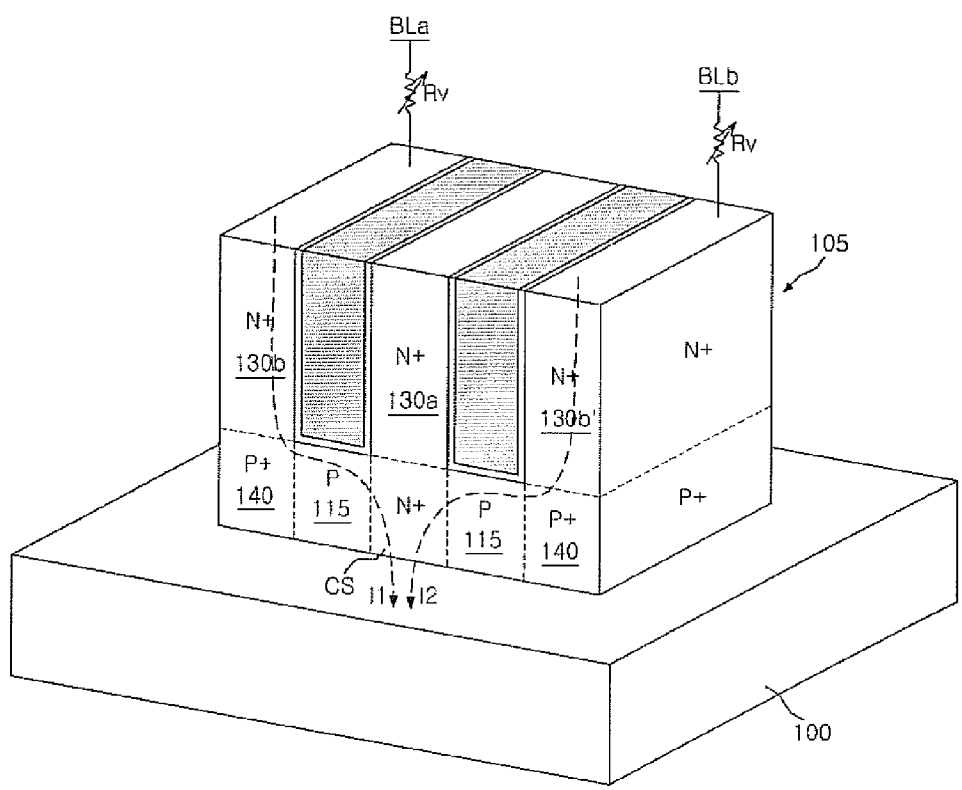
FIG. 6 is a perspective view illustrating a semiconductor integrated circuit apparatus manufactured according to an embodiment of the inventive concept.

In the variable resistance memory device formed as described above, as illustrated in FIGS. 5 and 6, when a selected gate 125 is turned on, and current is provided through a bit line (not shown) coupled to a selected drain 130b or 130b', a channel is formed between the source 130a and the selected drain 130b or 130b' at both sides of the selected gate 125. The channel may be substantially parallel to a surface of the semiconductor substrate 100. Therefore, the current provided from the bit line flows to the semiconductor substrate 100, for example, to a common source, which may be formed in the semiconductor substrate 100, through the selected drain 130b or 130b', the channel region 115 (or the first impurity region 115), and a lower region of the source 130a. At this time, the second impurity region 140 may allow the current injected into the selected drain 130b or 130b' to be discharged through the lower region of the source 130a, rather than being discharged directly to the substrate which is positioned below the drain region 130b or 130b'.

As a result, the lower region of the source 130a may discharge a current of one transistor TR1 and a current of the other current TR2 into a common source in the semiconductor substrate. Therefore, the lower region of the source 130a may correspond to a common source node of the horizontal channel transistor.

In a structure of an existing horizontal channel transistor, semiconductor layers of double layers having different etch selectivity is epitaxially grown, and a lower semiconductor layer is formed by an appropriate oxidation and patterning process to form a common source node. However, the process of continuously eptaxially growing the semiconductor layers formed of different materials from each other may increase a fabrication process time. Further, technology for forming a pattern to support an upper semiconductor layer in a central portion of the upper semiconductor layer is accompanied with a complicated process, and in an oxidation process of the lower semiconductor layer, an oxidation material is transferred to a gate and may cause degradation of electrical characteristics.

However, in the embodiment, since the active island may be formed by etching the semiconductor substrate and the common source node may be formed through ion implantation of an impurity with a self-aligned manner, the 3D semiconductor device having the horizontal channel and the common source node may be manufactured without a complicated process.

The inventive concept is not limited to the above-described embodiment. In the embodiment, after the source 130a and the drain 130b are formed, the second impurity region 140 is selectively formed below the drain 130b.

Figure 7:
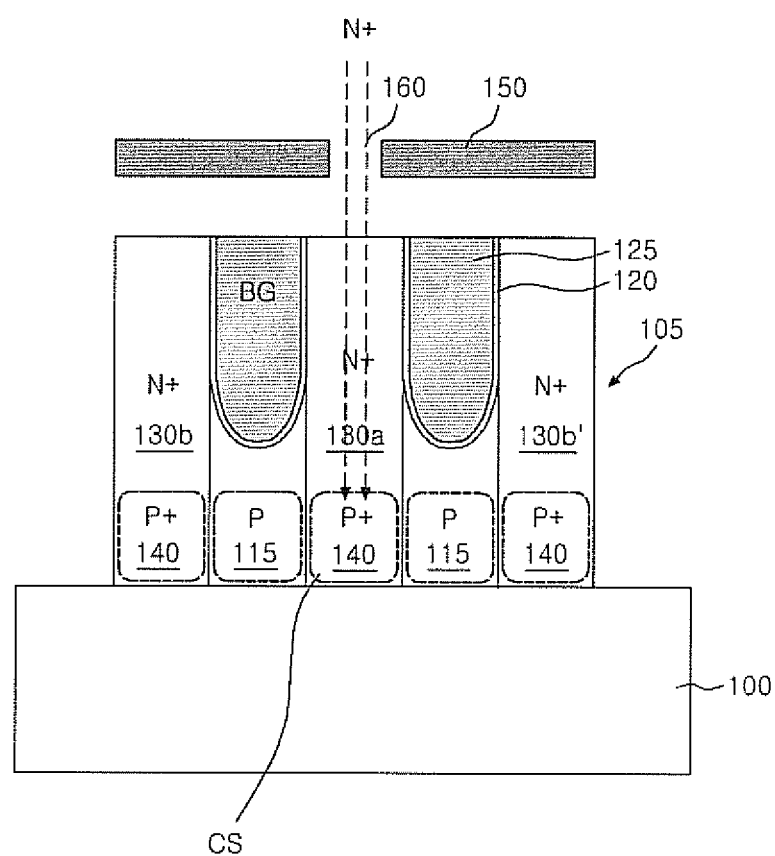
FIG. 7 is a view illustrating a method of manufacturing a semiconductor integrated circuit apparatus according to an embodiment of the inventive concept.

However, the inventive concept is not limited thereto, and a common source may be formed in a subsequent process as illustrated in FIG. 7.

That is, before a source and a drain are formed, a second impurity region 140 is formed in a lower region (including a lower region of the source) of an active island 105 using a gate 124 as a mask. Subsequently, a source 130a and a first and second drain 130b and 130b' are formed by implanting high concentration N type impurities into an upper region of the active island 105 using the gate as a mask. After a mask pattern 150 is formed to expose the source 130a, high concentration N type impurities 160 are implanted into a lower region below of the source 130a. Therefore, the lower region of the source region 130a having a concentration P type conductivity is counter-doped with the N type impurities to form a common source node CS.

As specifically described above, according to the inventive concept, after the active island is formed by etching the semiconductor substrate, the common source node through the impurity ion implantation and the horizontal channel structure may be formed in the active island.

In particular, in the common source node, path flow of current is controlled according to formation of an impurity region without sidewall oxidation and sidewall patterning, and thus the common source node may be formed without a complicated process.

Therefore, the 3D horizontal channel structure and the common source node may be fabricated without a multiple epitaxial process, a complicated oxidation process, and a patterning process.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor integrated circuit apparatus, comprising:
    a semiconductor substrate having an upper surface at a first level;
    an active island vertically protruding from the upper surface of the semiconductor substrate up to a second level, wherein each of the semiconductor substrate and the active island have a first conductive type;
    first and second buried gates each formed in the active island and at a third level, wherein the first buried gate is spaced from the second buried gate, wherein the third level is between the first and the second level;
    a source doped with a second conductive type impurity which is opposite to the first conductive type, wherein the source is formed in the active island between the first buried gate and the second buried gate, wherein the source is formed at the third level;
    a common source formed in the active island under the source, wherein the common source is provided at a fourth level, wherein the fourth level is between the first and the third level;
    first and second drains each doped with the second conductive type impurity, wherein the first and the second drains are formed in the active island at the third level, wherein the first drain is formed in the active island corresponding to an outer side region of the first buried gate, wherein the second drain is formed in the active island corresponding to an outer side region of the second buried gate; and
    first and second current blocking layers discharging current into the semiconductor substrate through the common source, wherein each of the first and the second current blocking layers are in the active island at the fourth level, wherein the first current block layer is provided under the first drain, wherein the second current block layer is provided under the second drain.

2. The semiconductor integrated circuit apparatus of claim 1, further comprising:
    a first variable resistor coupled to the first drain; and
    a second variable resistor coupled to the second drain.

3. The semiconductor integrated circuit apparatus of claim 1, wherein first and second channels are formed in the active island below the first and the second buried gates, respectively.

4. The semiconductor integrated circuit apparatus of claim 1, wherein each of the current blocking layers includes an impurity region doped with the first conductive type impurity.

5. The semiconductor integrated circuit apparatus of claim 1,
    wherein a first gate insulating layer is interposed between the active island and the first buried gate,
    wherein a second gate insulating layer is interposed between the active island and the second buried gate.

6. The semiconductor integrated circuit apparatus of claim 1, wherein each of the first and the second buried gates has a depth shallower than a thickness of the active island.

* * * * *